US006788786B1

(12) United States Patent
Kessler et al.

(10) Patent No.: US 6,788,786 B1
(45) Date of Patent: Sep. 7, 2004

(54) MULTIMEDIA PATCHING BOX

(75) Inventors: Bradley Scott Kessler, Inver Grove Heights, MN (US); Jeffrey Scott Hartzler, Minnetonka, MN (US); Cory Lee Grabinger, Maple Grove, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 568 days.

(21) Appl. No.: 09/708,800

(22) Filed: Nov. 8, 2000

Related U.S. Application Data

(63) Continuation-in-part of application No. 09/667,877, filed on Sep. 22, 2000.

(51) Int. Cl.[7] .............................................. H04M 1/00
(52) U.S. Cl. ................................................ 379/413.04
(58) Field of Search ....................... 379/413.04, 413.02, 379/399.01, 326, 327, 328; 361/724, 728, 748, 755

(56) References Cited

U.S. PATENT DOCUMENTS 5,363,440 A  * 11/1994  Daoud ................... 379/413.02
5,550,916 A  *  8/1996  Daoud ................... 379/413.02

OTHER PUBLICATIONS

HOMEWORX™, "Home Integrated Services Unit", ADC Telecommunications, pp. 1–4 (May 1999).
FL1000 Customer Premises Fiber Distribution Products, ADC Telecommunications, pp. 1–7 (Sep. 1998).

* cited by examiner

*Primary Examiner*—Jack Chiang
(74) *Attorney, Agent, or Firm*—Merchant & Gould P.C.

(57) ABSTRACT

A multimedia patching box including a generally rectangular housing. The housing includes a first wall positioned opposite from a second wall. The housing also includes opposing third and fourth walls that extend between the first and second walls. A panel is mounted adjacent the front of the housing. The panel is mounted to pivot about a pivot axis between an open position and a closed position. The pivot axis is located adjacent to the third wall of the housing and extends generally along the third wall of the housing. A plurality of multimedia connectors are mounted on the panel. The housing defines at least one cable access opening defined through at least one of the first and second walls at a location adjacent the third wall. A cable management structure is connected to the back side of the panel. The cable management structure defines a cable guiding channel that extends generally along the pivot axis of the panel and generally aligns with the at least one cable access opening.

10 Claims, 21 Drawing Sheets

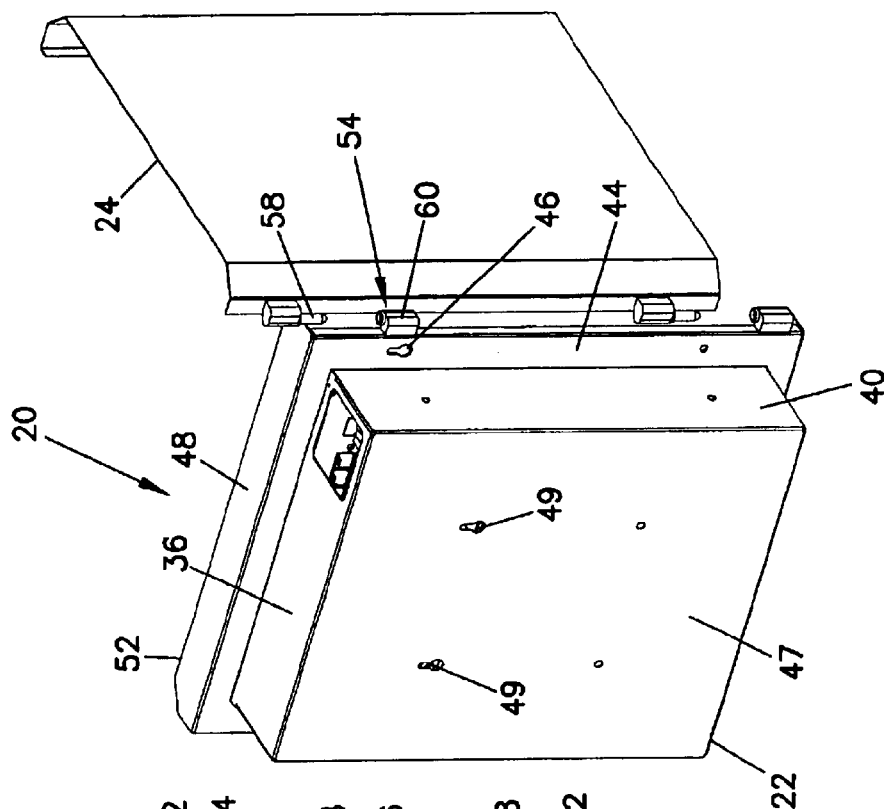
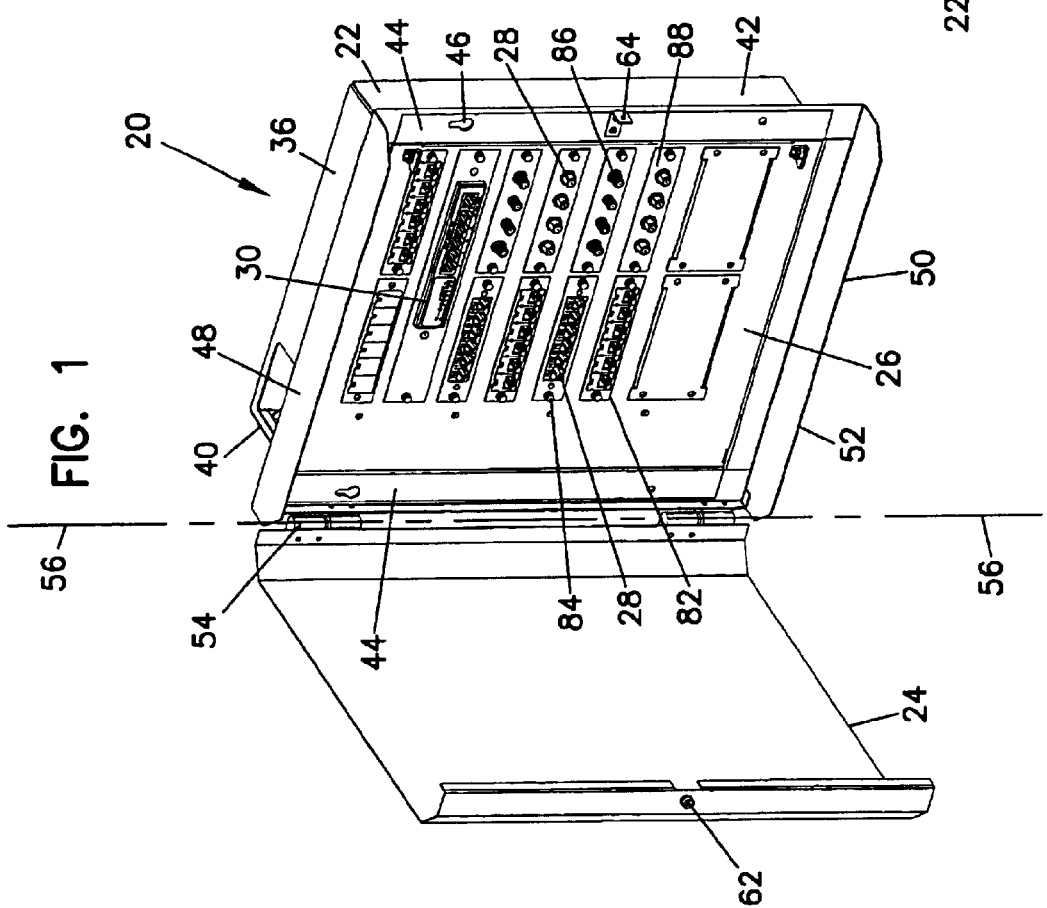

FIG. 4A
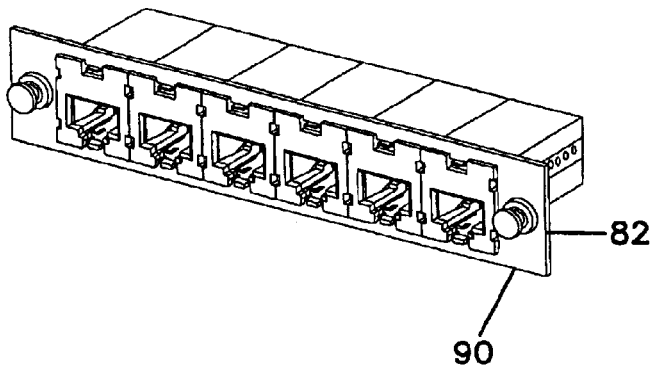
FIG. 4B
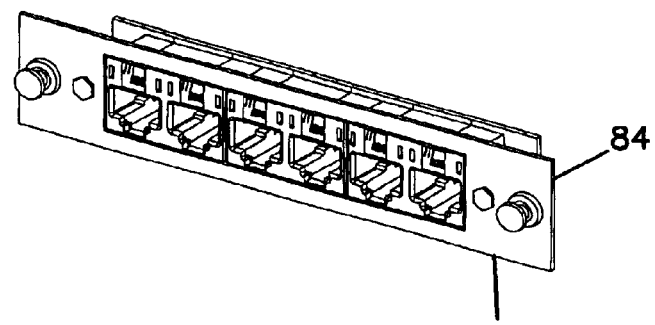
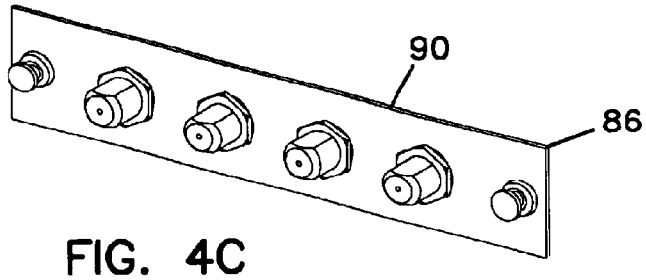
FIG. 4C
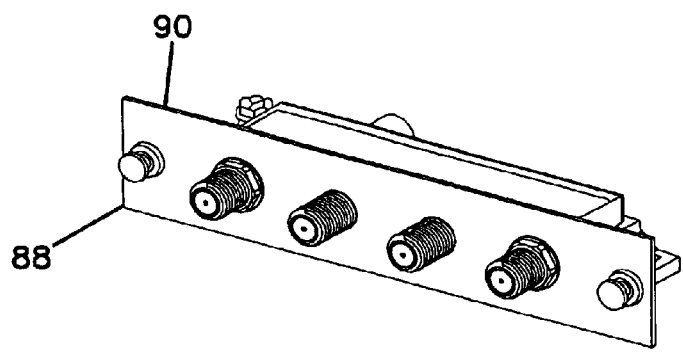
FIG. 4D

MULTIMEDIA PATCHING BOX

CROSS REFERENCE TO RELATED APPLICATIONS

This application is a continuation-in-part of U.S. patent application Ser. No. 09/667,877 which was filed on Sep. 22, 2000 and is currently pending.

FIELD OF THE INVENTION

The present invention relates generally to multimedia equipment. More particularly, the present invention relates to boxes for use in patching multimedia cabling.

BACKGROUND OF THE INVENTION

For years, homes and small businesses typically had relatively simple cabling needs. For example, rooms were typically wired or cabled to include a single jack for providing access to a single phone line. However, today's residential and small business environment is vastly different. For example, home and small business offices now require access to multiple video, data and fax applications. Further, homes and small businesses now commonly include co-axial cabling for television access, cabling for security systems, cabling for multiple telephone and data lines, and cabling for video, s-video and audio transmissions. What is needed is an improved patching system particularly applicable to the residential and small business environment.

SUMMARY OF THE INVENTION

One aspect of the present invention relates to multimedia patching box including a generally rectangular housing. The housing includes a first wall positioned opposite from a second wall. The housing also includes opposing third and fourth walls that extend between the first and second walls. A panel is mounted adjacent the front of the housing. The panel is mounted to pivot about a pivot axis between an open position and a closed position. The pivot axis is located adjacent to the third wall of the housing and extends generally along the third wall of the housing. A plurality of multimedia connectors is mounted on the panel. The housing defines at least one cable access opening defined through at least one of the first and second walls at a location adjacent the third wall. A cable management structure is connected to the back side of the panel. The cable management structure defines a cable guiding channel that extends generally along the pivot axis of the panel and generally aligns with the at least one cable access opening.

Another aspect of the present invention relates to a multimedia patching box including a generally rectangular housing. The housing includes a first wall positioned opposite from a second wall, and opposing third and fourth walls that extend between the first and second walls. The housing further including a front and a back. A panel is mounted adjacent the front of the housing. A plurality of multimedia connectors is mounted on the panel. The housing defines at least on cable access structure for allowing cables to enter or exit the housing. The cable access structure includes a first notch in the first wall adjacent the back of the housing, a second notch defined in the second wall adjacent the back of the housing, and an open region located at the back of the housing that extends continuously from the first notch to the second notch.

A further aspect of the present invention relates to a method for managing cables in a multimedia patching box. The patching box includes a connector mounting panel having a front side and a back side. The patching box also includes a plurality of media connectors mounted on the panel. The method includes terminating cables to the connectors at the back side of the panel. The method also includes routing the cables laterally across the back side of the panel from the connectors to a vertical cable management structure. The method further includes routing the cables vertically within the cable management structure to a cable access opening for allowing the cables to exit or enter the patching box.

BRIEF DESCRIPTION OF THE DRAWINGS

FIG. 1 is a front, perspective view of a multimedia patching box constructed in accordance with the principles of the present invention;

FIG. 2 is rear, perspective view of the multimedia patching box of FIG. 1;

FIG. 4A illustrates a RJ45 6-port module;

FIG. 4B illustrates RJ45 6-port bridged module;

FIG. 4C illustrates an F-type 4-port video module;

FIG. 4D illustrates a video module 4-port splitter;

Figure 3:
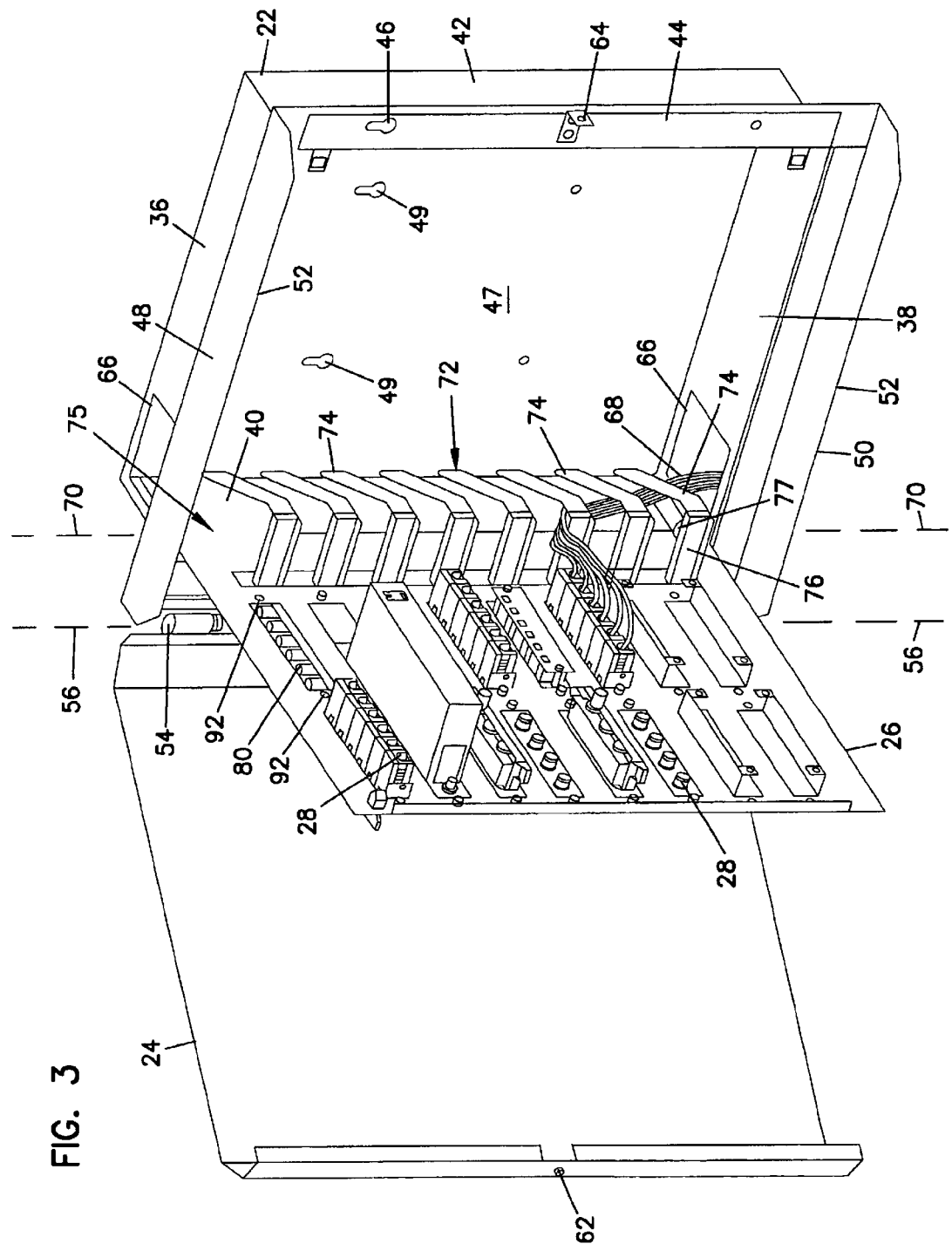
FIG. 3 illustrates the multimedia patching box of FIG. 1 with a connector mounting panel of the box pivoted open.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

I. Multimedia Patching Box

FIGS. 1–3 show a multimedia patching box 20 constructed in accordance with the principles of the present invention. Generally, the box 20 includes a housing 22 having a hinged front cover 24. A connector mounting panel 26 is pivotally mounted within the enclosure 22. A plurality of multimedia connectors 28 (e.g., RJ45 jacks, F-type coaxial connectors, BNC-type connectors, RCA-type connectors, ST-type connectors, etc.) is mounted on the mounting panel 26. Other structures (e.g., Ethernet hubs 30, video splitters 86, RJ45 bridging circuits 84, etc.) can also be mounted on the panel 26.

The housing 22 of the patching box 20 includes a top wall 36 spaced from a bottom wall 38. Two spaced-apart side walls 40 and 42 extend vertically between the top and bottom walls 36. The back of the housing is enclosed by a rear wall 47, and the front of the housing is enclosed by the hinged front cover 24. Openings 49 are defined through the rear wall 47 for use in mounting the housing 22 to a flat wall surface. For example, the housing can be secured to a flat wall surface by conventional fasteners (e.g., screws or wall anchors) that extend through the openings 49.

The housing also includes side flanges 44 that project laterally outwardly from the side walls 40 and 42. The side flanges 44 define openings 46 for use in mounting the housing 22 to a wall. For example, the housing 22 can be mounted between studs found in a typical residential drywall application, and the flanges can be secured to the studs by conventional fasteners (e.g., screws) that extend through the openings 46. Preferably, the housing 22 is made of a material such as sheet metal or plastic.

The housing 22 further includes top and bottom flanges 48 and 50 that project forwardly from the top and bottom walls 36 and 38, respectively. The flanges 48, 50 have outer edges 52 that conform generally to the shape of the front cover 24 such that when the front cover 24 is closed, the front edges 52 are generally flush with the outer surfaces of the cover 24. Thus, when the front cover 24 is closed, the top and bottom flanges 48, 50 function to enclose the top and bottom ends of the cover 24. The top and bottom flanges 48 and 50 can be integrally formed as a single piece with their respective top and bottom walls 36 and 38. Alternatively, the top and bottom flanges 48 and 50 can be removably connected to their respective top and bottom walls 36 and 38 by conventional techniques such as fasteners (e.g., screws or bolts).

Referring to FIG. 1, the front cover 24 of the housing 24 is connected to the left side flange 44 by hinges 54 such that the front cover 24 can pivot about vertical axis 56. The hinges 54 include pins 58 that pivot within sockets 60. The cover 24 can easily be removed from the housing 22 by lifting the pins 58 from the sockets 60 as shown in FIG. 2. It may be desirable to a user to remove the cover 24 to facilitate mounting the housing 22 to a wall or other structure.

The front cover 24 is preferably made of sheet metal, but can also be made of a transparent or translucent material such as polycarbonate. A latch 62 is provided on the cover 24 for holding the cover 24 closed. The latch interlocks with a catch 64 provided on the right side flange 44.

As shown in FIG. 3, the top and bottom walls 36 and 38 of the housing 22 define cable access openings 66. The top and bottom cable openings 66 are both located adjacent the left side wall 40. The cable access openings 66 are preferably sized to allow a plurality of cables 68 to enter/exit the interior of the housing 22.

Still referring to FIG. 3, the connector mounting panel 26 is pivotally connected to the top and bottom walls 36 and 38 of the housing 24 so as to be free to pivot about vertical axis 70. For example, the mounting panel 26 can include top and bottom hinge pins (not shown) that fit within corresponding openings (not shown) defined by the top and bottom walls 36 and 38. Preferably the pivot axis 70 is located adjacent the cable access openings 66 defined through the top and bottom walls 36 and 38.

To facilitate cable management within the housing 22, a cable management structure 72 is connected to the back side of the connector mounting panel 26 at a location adjacent the pivot axis 70. The cable management structure 72 includes a plurality of vertically spaced-apart brackets 74 that cooperate to define a vertical channel 75 for guiding/receiving cables. Preferably, the vertical channel 75 is aligned generally with the top and bottom cable access openings 66 regardless of whether the connector mounting panel 26 is open or closed. It is understood that the phrase "aligned generally with" means that cables can be fed from the openings 66 to the channel 75 without excessive bending. Preferably, the channel 75 extends generally along the pivot axis 70 of the panel 26. It is understood that the phrase "extends generally along" means that the channel and the pivot axis 70 extend in the same general direction.

The cable brackets 72 each include a first leg 74 that is spaced apart from and opposes the back side of the connector mounting panel 26, and a second leg 76 that interconnects the first leg with the back side of the connector mounting panel 26. The first legs 74 preferable have at least portions that angle upwardly relative to the second legs 76. Curved bending radius limiters 77 are preferably mounted on the second legs 76.

Referring still to FIG. 3, the channel 75 is enclosed on three sides. For example, one side is enclosed by the second legs 76, and the two other sides are enclosed by the first legs 74 and the back side of the connector mounting panel 26. The side of the channel 75 opposite from the second legs 76 is open when the connector mounting panel 26 is open as shown in FIG. 3. However, when the panel 26 is closed, the open side of the channel 75 is closed by the left side wall 40 of the housing 22.

When the patching box 20 is loaded and wired, cables are connected to portions of the connectors 28 that project outwardly from the back side of the connector mounting panel 26. To facilitate cable management, the cables are routed from the connectors 28 laterally across the back side of the connector mounting panel 26 to the vertical channel 75. To enter the channel 75, the cables are routed between the second legs 76. The radius limiters 77 prevent excessive bending of the cables 68. Within the vertical channel 75, the cable are routed vertically to at least one of the cable access openings 66. The positioning of the cable management structure 72 adjacent the pivot axis 70 and the cable access openings 66 allows the connector mounting panel 26 to be opened and closed without interference from the cables.

The connectors 28 are preferably mounted as modules within rectangular slots 80 formed through the connector mounting panel 26. FIGS. 4A–4D show some of the modules in isolation from the patching box 20. For example, FIG. 4A shows a RJ45 6-port module 82, FIG. 4B shows an RJ45 6-port bridged module 84, FIG. 4C shows an F-type 4-port video module 86, and FIG. 4D shows a video module 4-port splitter 88. Each of the modules 82–88 includes a mounting plate 90 including fasteners (e.g., Nylatch fasteners sold by Hartwell Corporation of Placentia, Calif.) that snap within openings 92 positioned on opposite ends of the slots 80. When the modules 82–88 are fastened to the connector mounting board 26, their corresponding media connectors preferably project through the slots 80.

II. Patching Example

Figure 5A:
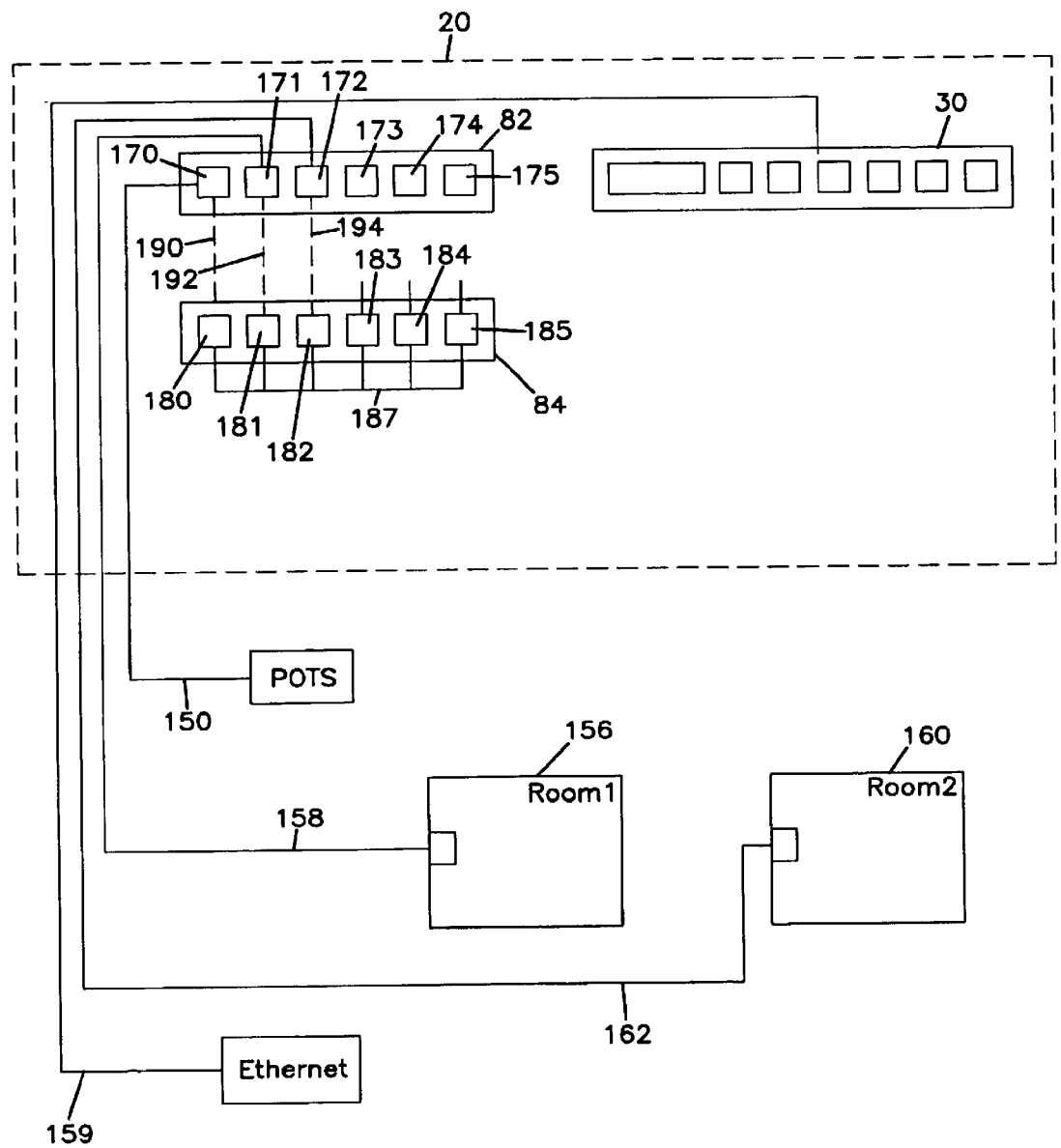
FIG. 5A schematically shows an exemplary cable lay-out for several connector modules of patching box of FIGS. 1–3.
Figure 5B:
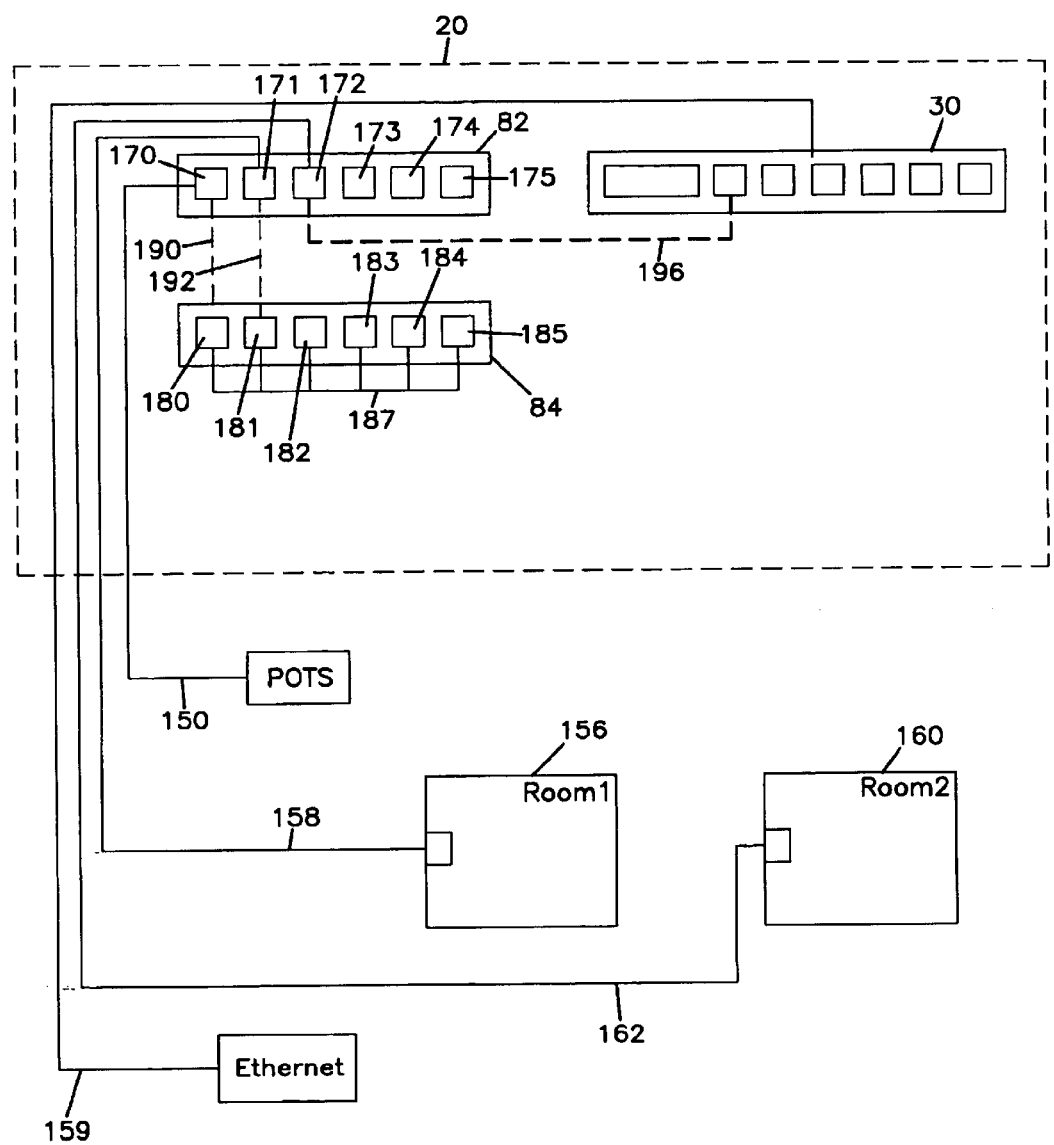
FIG. 5B schematically shows another exemplary cable lay-out for the connector modules shown FIG. 5A.

In use of the multimedia patching box 20, all incoming and outgoing cables are preferably terminated at the back side of the connector mounting panel 26. Patching of all cables is preferably conducted at the front side of the connector mounting panel 26. FIGS. 5A and 5B schematically show exemplary cable lay-outs for several connector modules of patching box 20.

Referring to FIG. 5A, the patching box 20 is shown including one RJ45 6-port module 82 having jacks 170–175, and a corresponding RJ45 6-port bridged module 84 having jacks 180–185. A bridging circuit 187 bridges the jacks 180–185 of the bridged module 84. The patching box 20 is also shown including an Ethernet hub 30.

Still referring to FIG. 5A, a telephone line 150 is connected to jack 170 of the RJ45 module 82. Jack 171 of the module 82 is connected to a jack in a first room 156 by twisted pair cable 158. Jack 172 of the module 82 is connected to a jack in a second room 160 by twisted pair cable 162. A first patch cord 190 connects jack 170 of the module 82 to jack 180 of the bridged module 84. Jack 180 is connected to jacks 181–185 of the bridged module 84 by bridging circuit 187. A second patch cord 192 connects jack 181 of the bridged module 84 to jack 171 of the module 82. A third patch cord 194 connects jack 182 of the bridged module 84 to jack 172 of the module 82. Ethernet line 159 is connected to hub 30. The other jacks 173–175 and 183–185 are available for future use/expansion.

In use, a telephone signal is transmitted through line 150 to jack 170. From jack 170, the signal is transmitted through patch cord 190 to the jacks 180–185 of the bridged module 84. From jacks 181 and 182, the signal is respectively transmitted to jacks 171 and 172 via patch cords 192 and 194. From jacks 171 and 172, the signal is respectively transmitted to rooms 156 and 160 via cables 158 and 162. While the signal has been described as traveling in one direction, it will be appreciated that the lines are bi-directional.

A significant benefit of the patching box 20 is the ability to easily change the media line provided to a given location by conducting a simple patching operation at the box 20. For example, the jack in room 162 can easily be changed from a phone jack to an Ethernet jack by disconnecting patch cord 194 and connecting a patch cord 196 between jack 172 and the Ethernet hub 30 (see FIG. 5B).

III. Alternative Multimedia Patching Box

Figure 6:
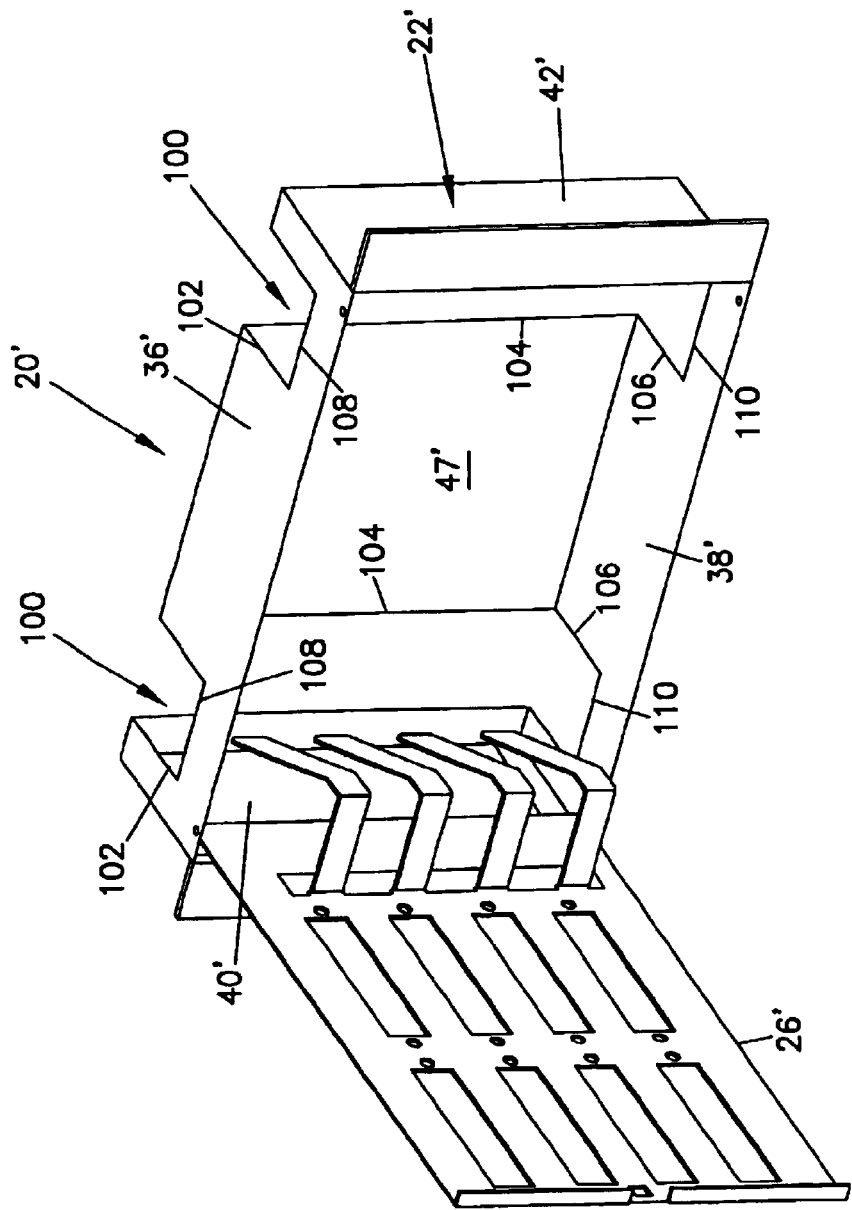
FIG. 6 is a front, perspective view of another multimedia patching box constructed in accordance with the principles of the present invention.
Figure 7:
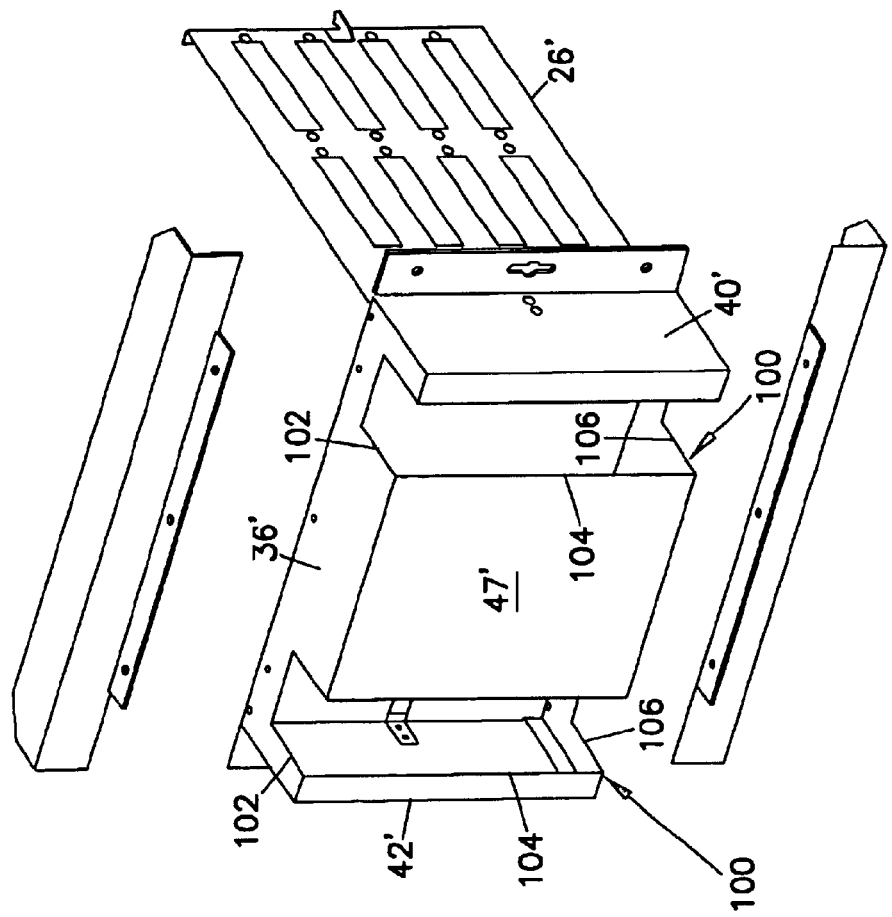
FIG. 7 is a rear, perspective view of the multimedia patching box of FIG. 6.

FIGS. 6 and 7 show another multimedia patching box 20' constructed in accordance with the principles of the present invention. The patching box 20' has many of the same components as the patching box 20 of FIGS. 1–3. For example, the box 20' includes a housing 22' a top wall 36', a bottom wall 38', and two spaced-apart side walls 40' and 42'. The back of the housing is partially enclosed by a rear wall 47', and the front of the housing can be enclosed by the hinged front cover (not shown). Additionally, a hinged connector mounting panel 26' is provided in the housing 22'.

The housing 20' of FIGS. 6 and 7 differs from the housing of FIGS. 1–3 because it includes modified cable access openings 100. The cable access openings 100 include top portions 102 (i.e., notches) defined by the top wall 36', rear portions 104 defined by the rear wall 47', and bottom portions 106 (i.e., notches) defined by the bottom wall 38'.

The top, rear and bottom portions 102–106 cooperate to define continuous vertical slots that open outwardly from the back side of the housing 22'. The top portions 102 extend from intermediate locations 108 of the top wall 36' to the rear plane of the housing 22'. The bottom portions 106 extend from intermediate locations 110 of the bottom wall 38' to the rear plane of the housing 22'. The rear portions 104 extend vertically along the back plane from the top portions 102 to the bottom portions 106.

Figure 8:
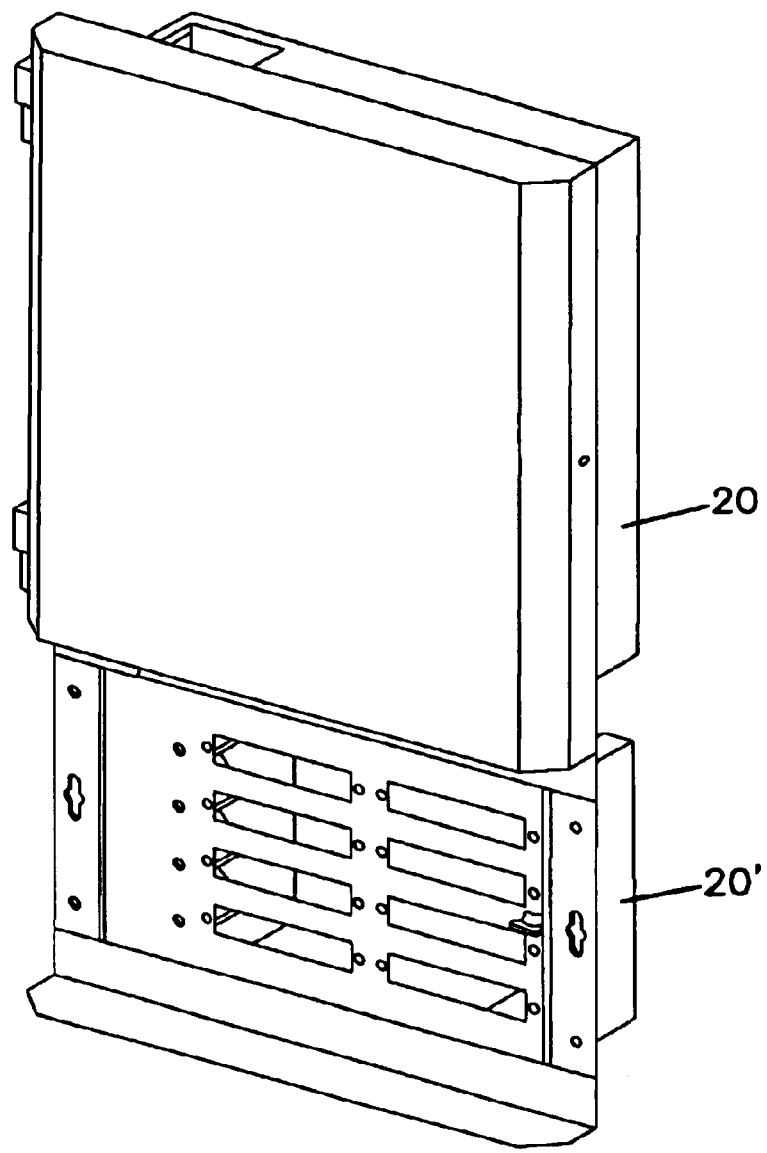
FIG. 8 shows the multimedia box of FIGS. 6 and 7 being used as an expansion module in combination with the multimedia box of FIGS. 1–3.

The open nature of the cable access openings 100 make the box 20' ideally suited for use as an expansion module. For example, if the box 20' is mounted beneath the box 20 as shown in FIG. 8, the left cable access opening 100 can readily receive the bundle of cables extending downwardly from the box 20 without requiring the box 20 to be re-cabled. Instead, the box 20' can be inserted directly over the bundle such that the bundle fits within the opening 100.

The right cable access opening 100 of the housing 22' allows the panel 26' to alternatively be hinged at the right side of the box 20' if desired. With such a configuration, cables corresponding to the box 20 (i.e., cables which are not terminated at the connector mounting panel 26' of the box 20') can be routed through the left cable access opening 100. In contrast, cables intended to be terminated at the box 20' can be fed through the right cable access opening 100 and then connected to the panel 26'.

Figure 9:
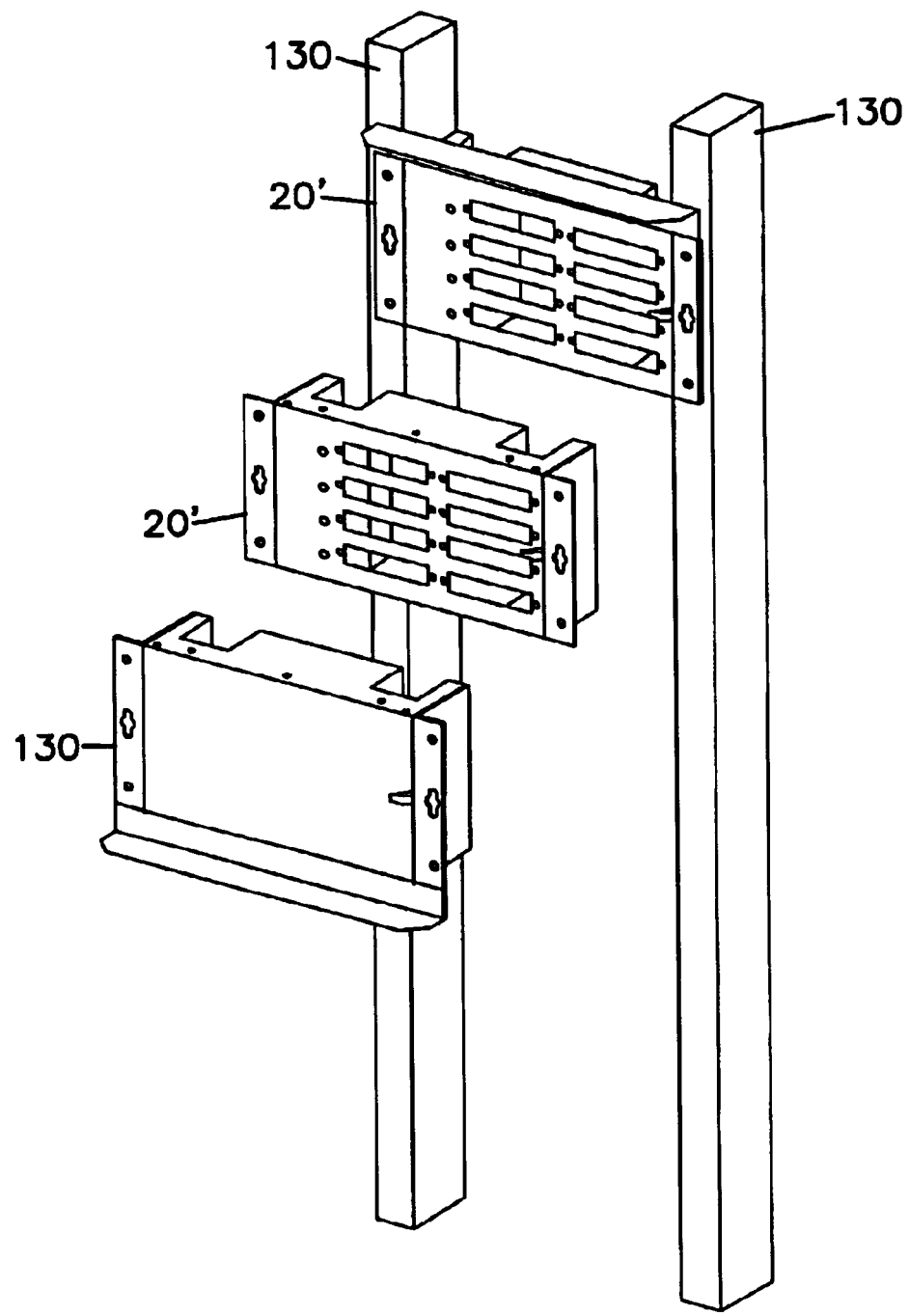
FIG. 9 shows several modular, stackable multimedia patching boxes in accordance with the principles of the present invention, the boxes are shown being mounted between vertical wall studs.

FIG. 9 illustrates the modular nature of the patching boxes 20' by showing two of the boxes 20' being mounted in stacked relation between two wall studs 130. Additional boxes 20' can be added to the stack as required by future cabling needs. FIG. 9 also shows a box 130 included in the stack for housing a multiple outlet A/C power bar or other auxiliary equipment.

IV. Patching System

Another aspect of the present invention relates to a patching system that uses a plurality of patch cords with different wiring configurations. The patch cords for each wiring configuration are preferably coded (e.g., number coded, color coded, etc.) to facilitate identifying particular cord types. Patch cords having the same configuration will have the same code. Packages of the patch cords, with the cords separated based on wiring configuration, can be provided with the patching box. As described in more detail below, by interchanging patch cords having different wiring configurations, different signals lines can be connected to desired designations.

Figure 10:
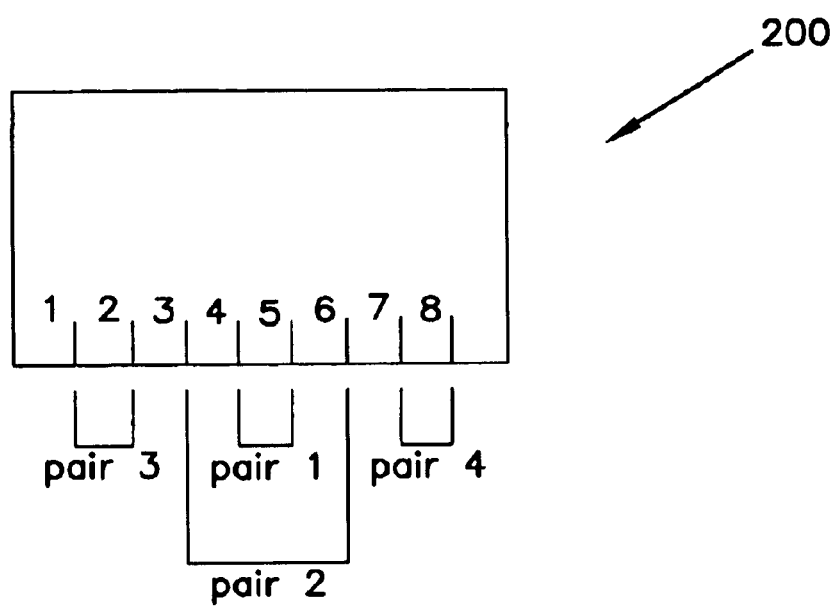
FIG. 10 is a schematic diagram of a contact/pin configuration for a typical telephone plug, FIGS. 11A–11H schematically show eight patch cords having different wiring configurations.

Each of the patch cords preferably includes an 8 contact plug connected at each end. FIG. 10 schematically illustrates a typical plug 200 (e.g., an RJ45 plug). The plug 200 includes eight spring contacts numbered from one to eight. The eight contacts form four separate circuits or pairs for conveying twisted pair (e.g., tip and ring) signals. FIG. 10 also shows a conventional pairing configuration in which springs 4 and 5 form a first pair, springs 3 and 6 form a second pair, springs 1 and 2 form a third pair, and springs 7 and 8 form a fourth pair.

Figure 11A:
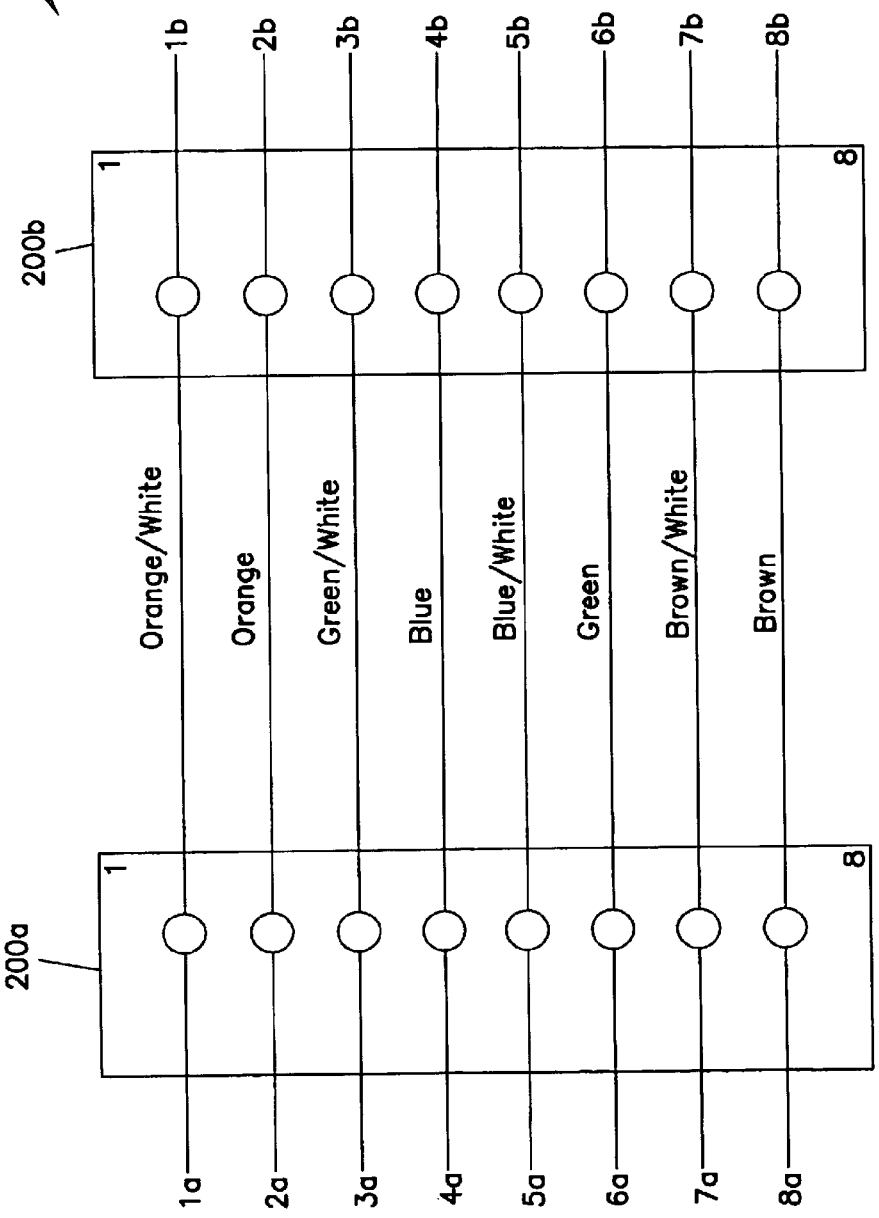

Conventionally, patch cords are typically wired such that contacts 1–8 of the first plug are connected to contacts 1–8 of the second plug, respectively. For example, FIG. 11A schematically shows a conventional patch cord 202 including a first plug 200a and a second plug 200b. As described above, the patch cord 202 is wired such that the contacts 1a–8a of the first plug 200a are connected to the contacts 1b–8b of the second plug 200b as follows: contact 1a to contact 1b; contact 2a to contact 2b; contact 3a to contact 3b; contact 4a to contact 4b; contact 5a to contact 5b; contact 6a to contact 6b; contact 7a to contact 7b; and contact 8a to contact 8b.

Figure 11B:
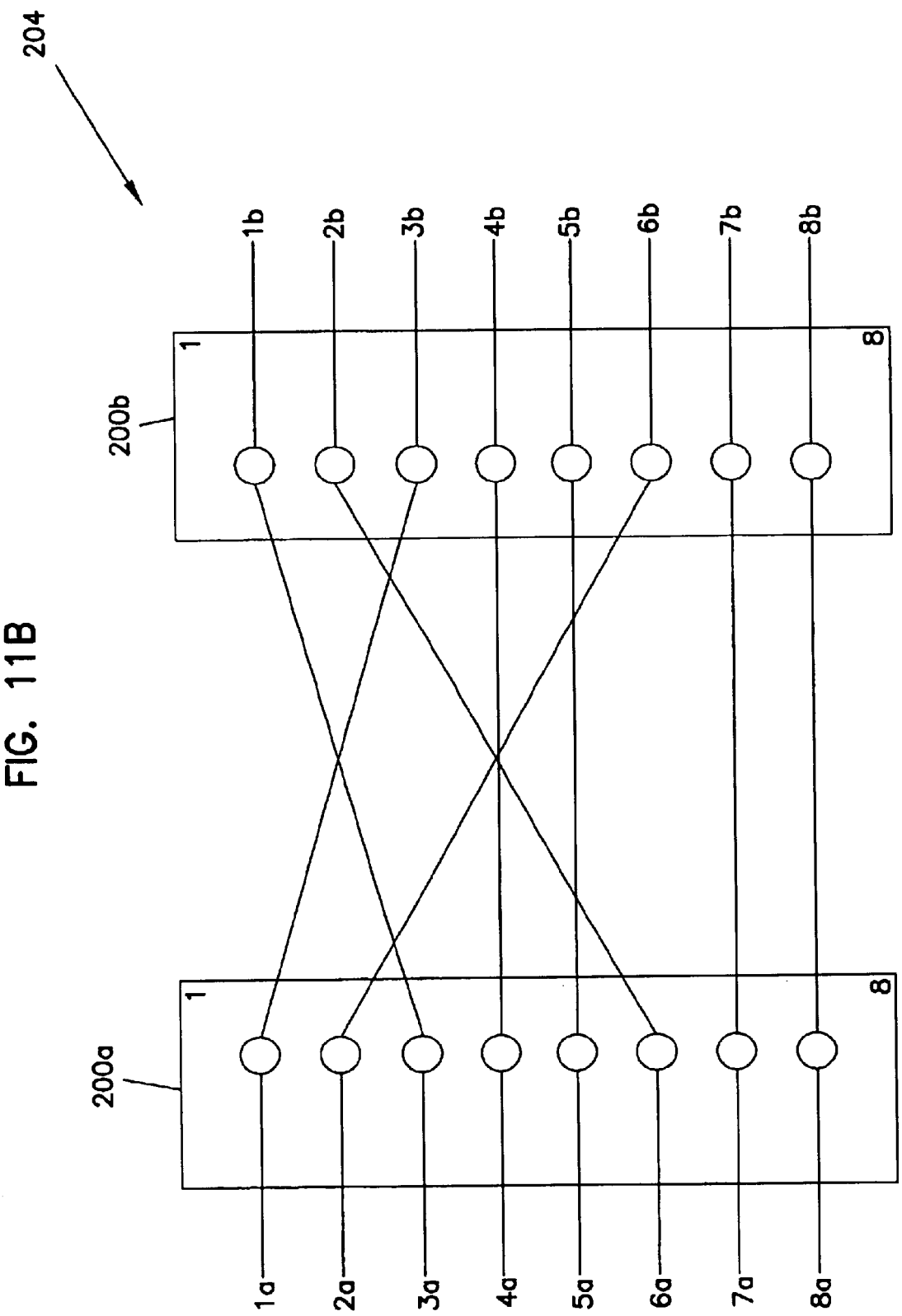

FIG. 11B schematically shows a patch cord 204 having a second wiring configuration for connecting the first and second plugs 200a and 200b. For patch cord 204, the contacts of the plugs 200a and 200b are connected as follows: contact 1a to contact 3b; contact 2a to contact 6b; contact 3a to contact 1b; contact 4a to contact 4b; contact 5a to contact 5b; contact 6a to contact 2b; contact 7a to contact 7b; and contact 8a to contact 8b.

Figure 11C:
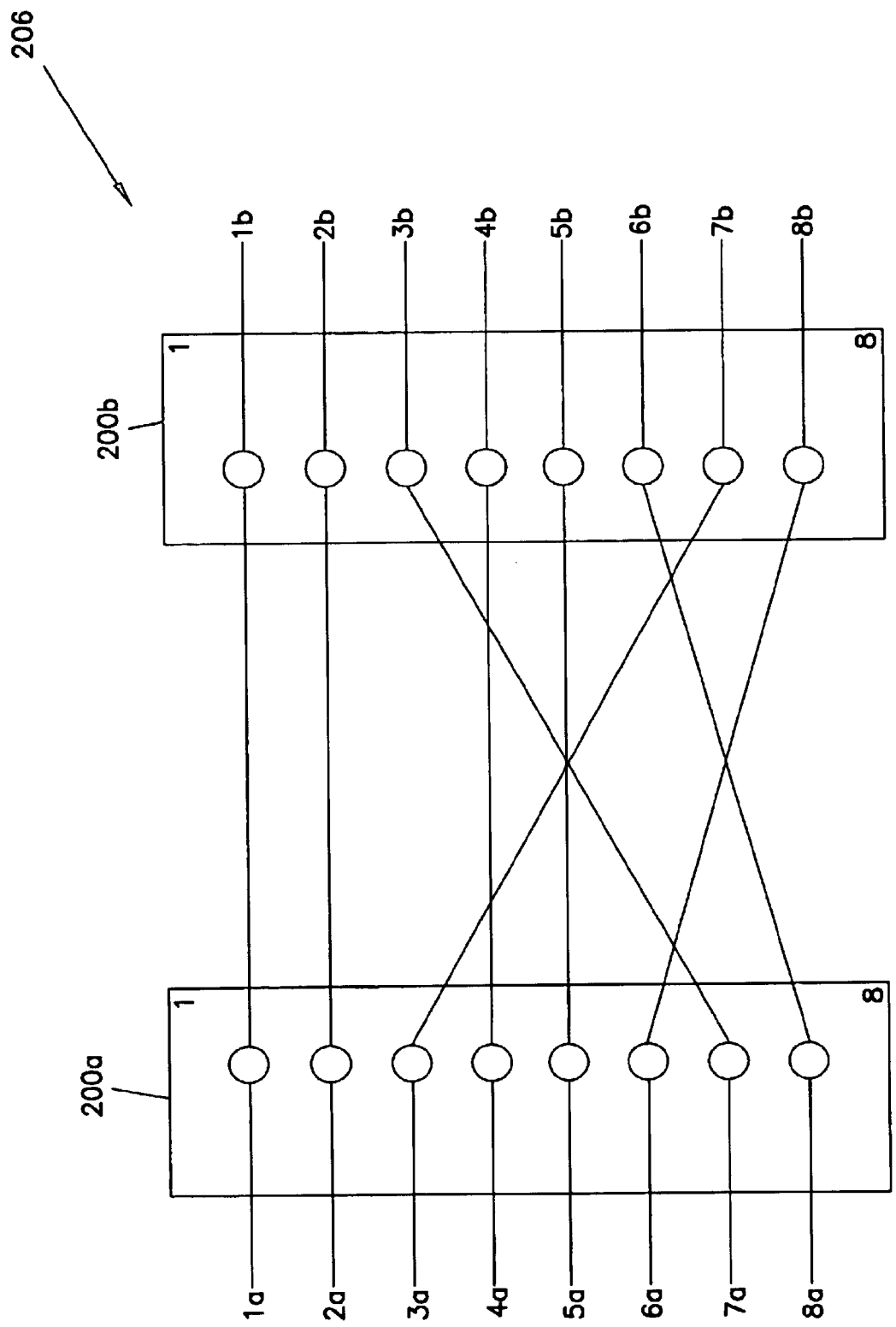

FIG. 11C schematically shows a patch cord 206 having a third wiring configuration for connecting the first and second plugs 200a and 200b. For patch cord 206, the contacts of the plugs 200a and 200b are connected as follows: contact 1a to contact 1b; contact 2a to contact 2b; contact 3a to contact 7b; contact 4a to contact 4b; contact 5a to contact 5b; contact 6a to contact 8b; contact 7a to contact 3b; and contact 8a to contact 6b.

Figure 11D:
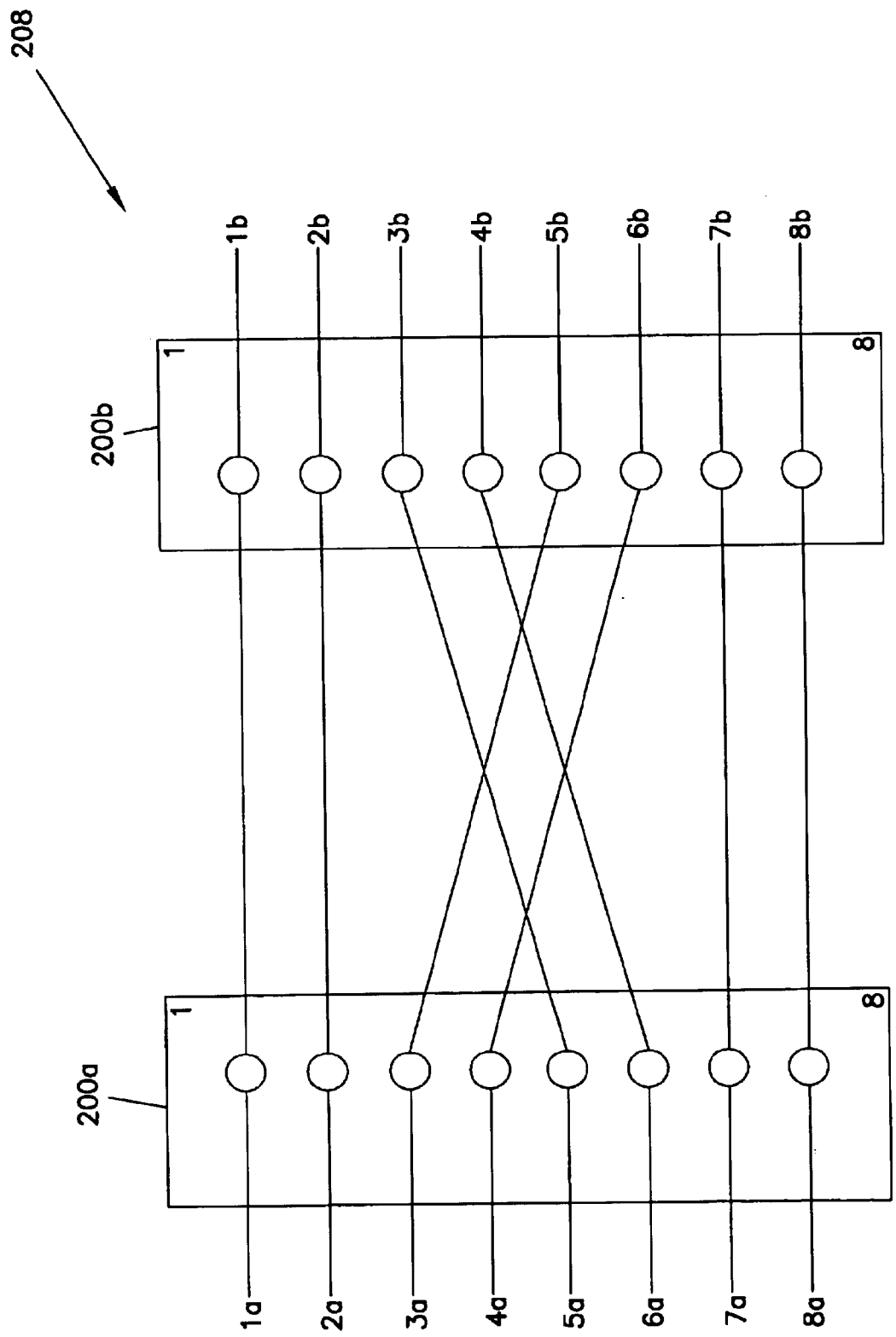

FIG. 11D schematically shows a patch cord 208 having a fourth wiring configuration for connecting the first and second plugs 200a and 200b. For patch cord 208, the contacts of the plugs 200a and 200b are connected as follows: contact 1a to contact 1b; contact 2a to contact 2b; contact 3a to contact 5b; contact 4a to contact 6b; contact 5a to contact 3b; contact 6a to contact 4b; contact 7a to contact 7b; and contact 8a to contact 8b.

Figure 11E:
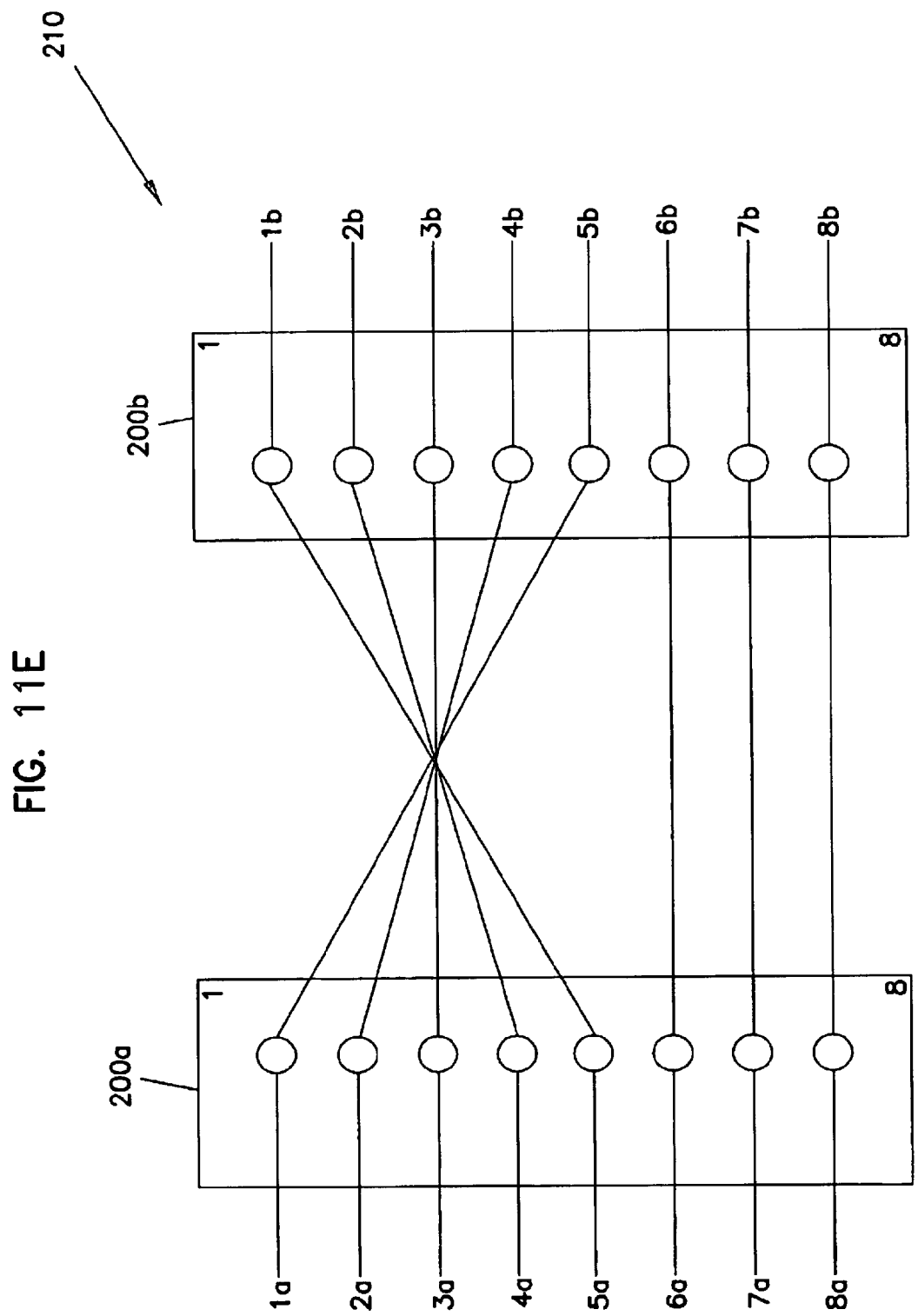

FIG. 11E schematically shows a patch cord 210 having a fifth wiring configuration for connecting the first and second plugs 200a and 200b. For patch cord 210, the contacts of the plugs 200a and 200b are connected as follows: contact 1a to contact 5b; contact 2a to contact 4b; contact 3a to contact 3b; contact 4a to contact 2b; contact 5a to contact 1b; contact 6a to contact 6b; contact 7a to contact 7b; and contact 8a to contact 8b.

Figure 11F:
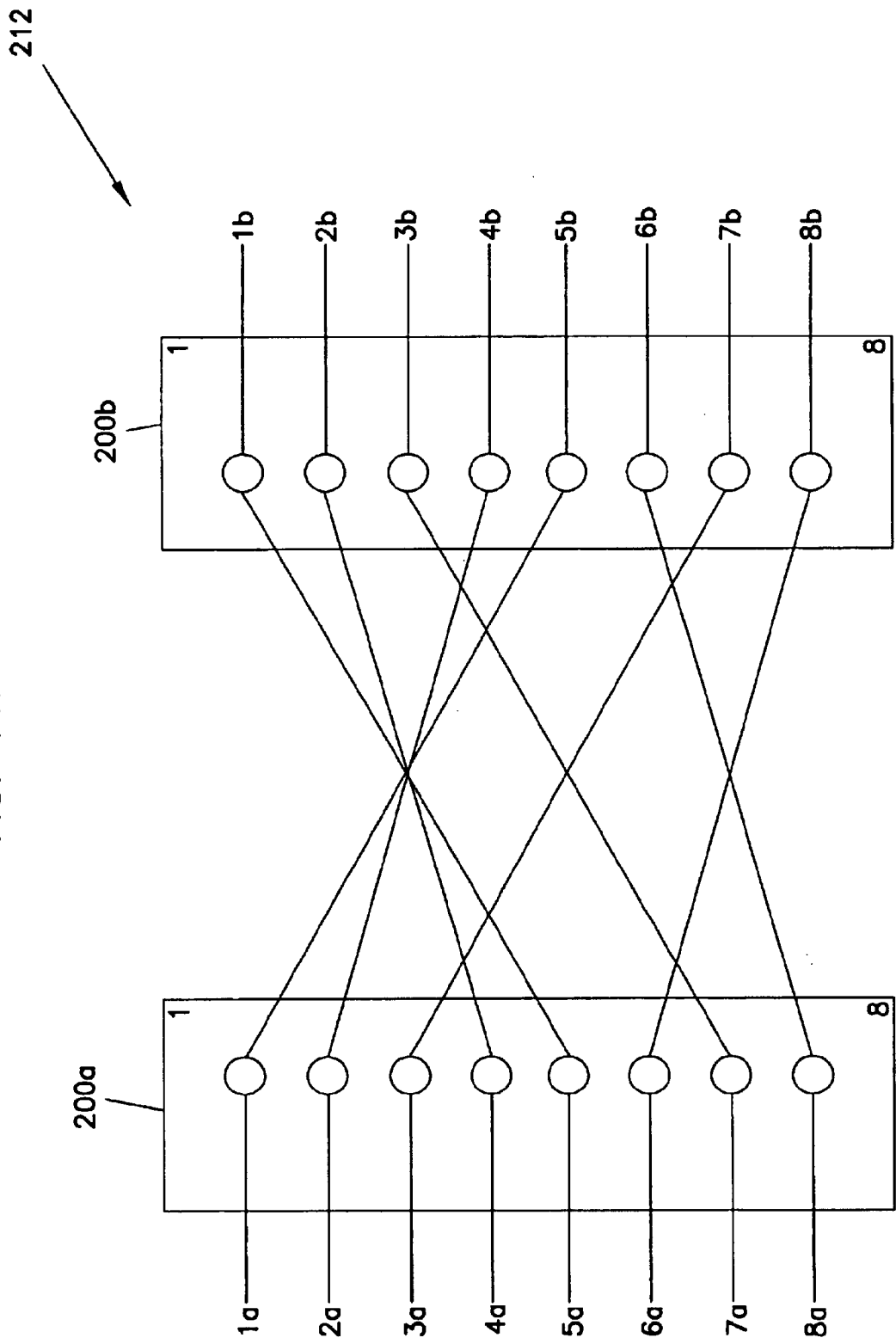

FIG. 11F schematically shows a patch cord 212 having a sixth wiring configuration for connecting the first and second plugs 200a and 200b. For patch cord 212, the contacts of the plugs 200a and 200b are connected as follows: contact 1a to contact 5b; contact 2a to contact 4b; contact 3a to contact 7b; contact 4a to contact 2b; contact 5a to contact 1b; contact 6a to contact 8b; contact 7a to contact 3b; and contact 8a to contact 6b.

Figure 11G:
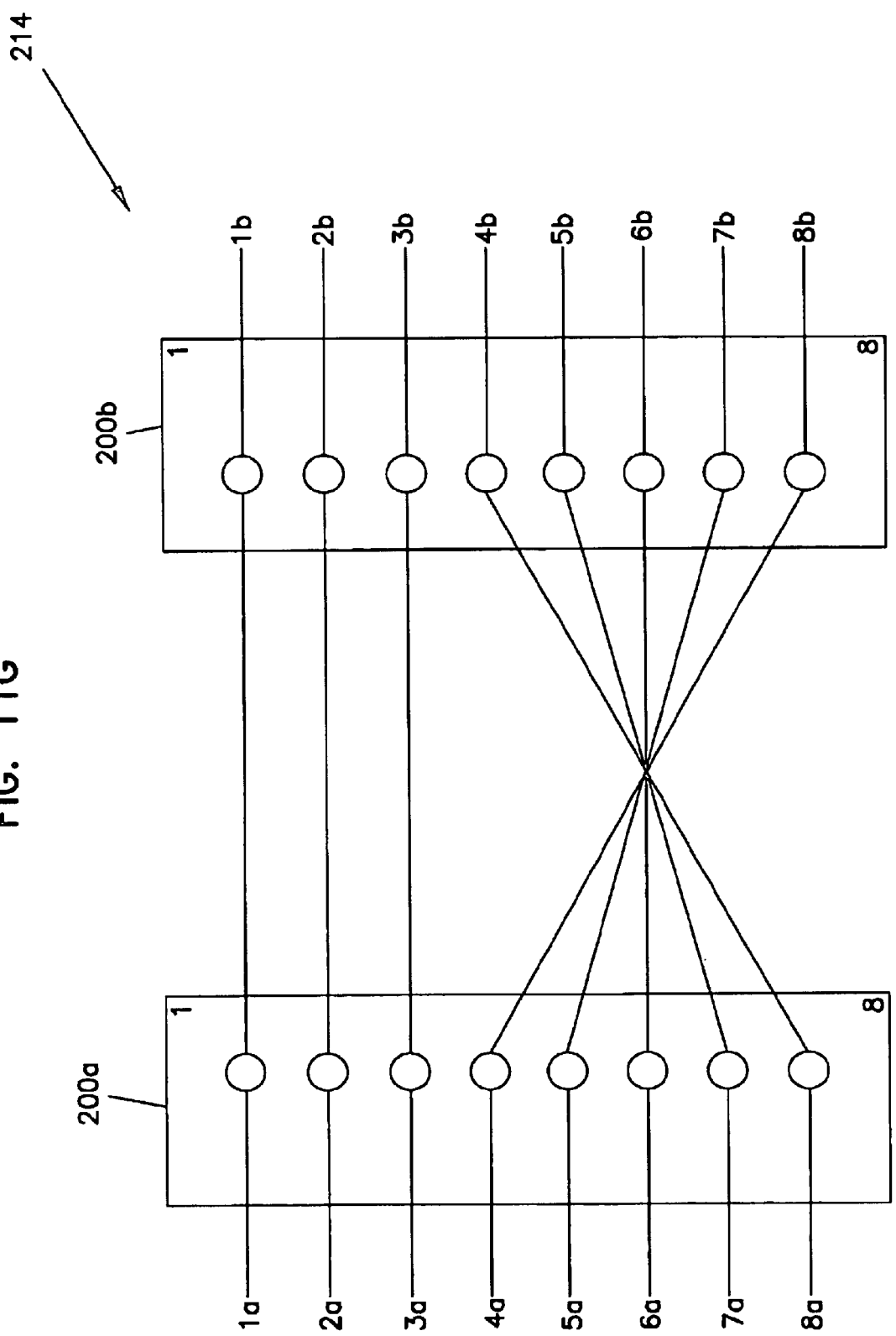

FIG. 11G schematically shows a patch cord 214 having a seventh wiring configuration for connecting the first and second plugs 200a and 200b. For patch cord 214, the contacts of the plugs 200a and 200b are connected as follows: contact 1a to contact 1b; contact 2a to contact 2b; contact 3a to contact 3b; contact 4a to contact 8b; contact 5a to contact 7b; contact 6a to contact 6b; contact 7a to contact 5b; and contact 8a to contact 4b.

Figure 11H:
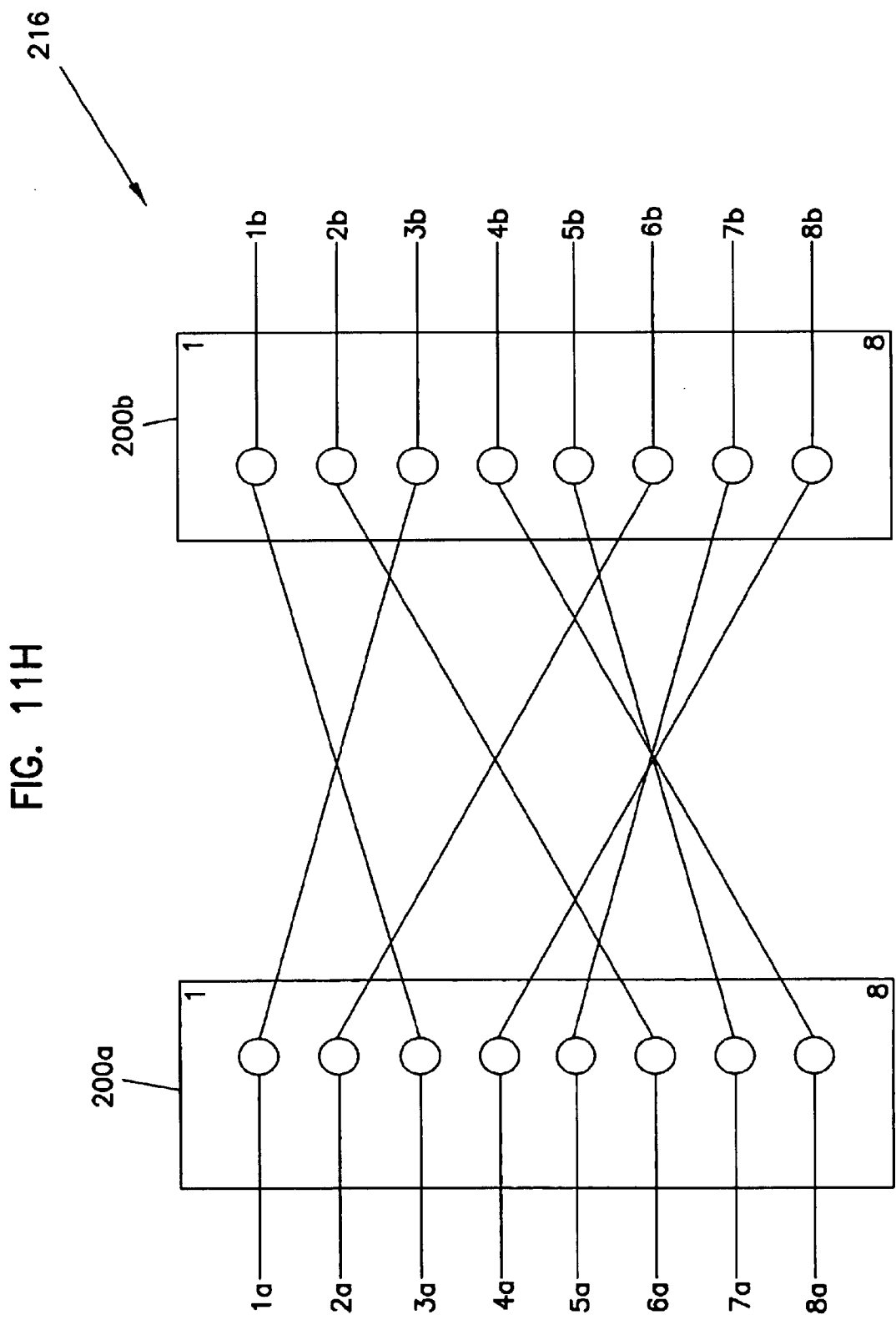

FIG. 11H schematically shows a patch cord 216 having an eighth wiring configuration for connecting the first and second plugs 200a and 200b. For patch cord 216, the contacts of the plugs 200a and 200b are connected as follows: contact 1a to contact 3b; contact 2a to contact 6b; contact 3a to contact 1b; contact 4a to contact 8b; contact 5a to contact 7b; contact 6a to contact 2b; contact 7a to contact 5b; and contact 8a to contact 4b.

Figure 12:
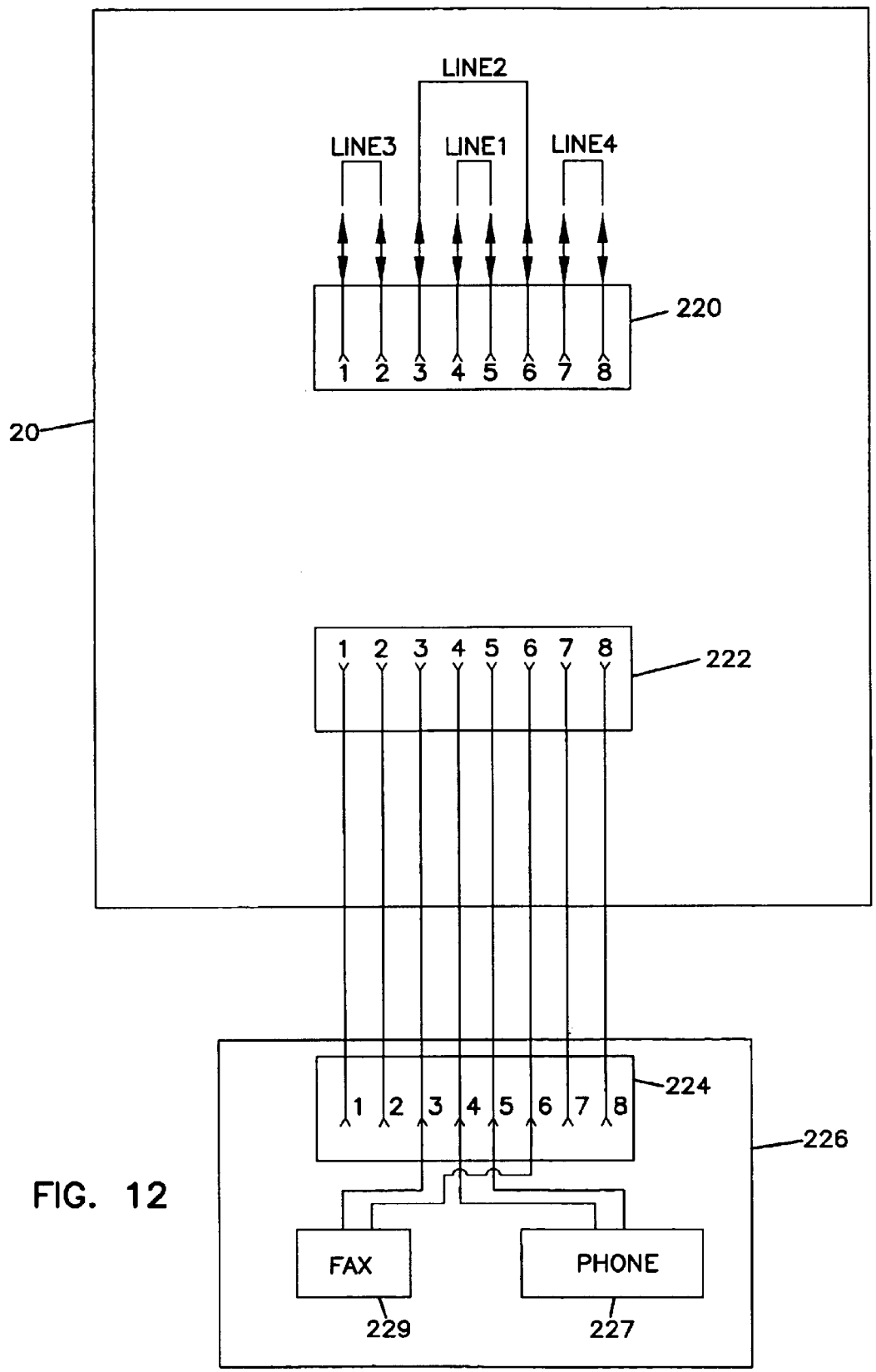
FIG. 12 schematically shows an exemplary patching situation/environment.

FIG. 12 shows a patching box 20 including a jack 220 (e.g., a jack that is part of a RJ45 6-port bridged module) and a jack 222 (e.g., a jack that is part of a RJ45 6-port module). The jack 222 is connected to a jack 224 located in room 226 (e.g., a bedroom or office). The room 226 includes a phone 227 connected to contacts 4 and 5 of the jack 224, and a fax machine 229 connected to contacts 3 and 6 of the jack 224. The jack 220 is connected to 4 media lines (e.g., telephone lines). For example, line 1 is connected to contacts 4 and 5 of the jack, line 2 is connected to contacts 3 and 6, line 3 is connected to contacts 1 and 2, and line 4 is connected to contacts 7 and 8. If a conventional patch cord 202 as shown in FIG. 11A is used to provide a patch between the jacks 220 and 222, the phone 227 is connected to line 1 and the fax machine is connected to line 2.

Conventionally, if a user wanted to change the lines provided to the phone 227 and the fax machine 229, a technician would typically be called to rewire the jack 220 to meet the users needs. By contrast, the system of differently wired patch cords 202–216 described above allows the user to change the lines provided to the phone 227 and the fax 229 by merely using/selecting a differently configured patch cord to patch between the jacks 220 and 222. For example, if the user wants to connect line 1 to the phone 227 and line 3 to the fax 229, this can be accomplished by using the patch cord 204 of FIG. 11B. To connect line 1 to the phone 227 and line 4 to the fax 229, the patch cord 206 of FIG. 11C would be used. To connect line 2 to the phone 227 and line 1 to the fax 229, the patch cord 208 of FIG. 11D would be used. To connect line 3 to the phone 227 and line 2 to the fax 229, the patch chord 210 of FIG. 11E would be used. To connect line 3 to the phone 227 and line 4 to the fax 229, the patch cord 212 of FIG. 11F would be used. To connect line 4 to the phone 227 and line 2 to the fax 229, the patch cord 214 of FIG. 11G would be used/selected. Finally, to connect line 4 to the phone 227 and line 3 to the fax 229, the patch cord 216 of FIG. 11H would be used/selected.

Besides the ability to easily change the telephone/media lines provided to a given designation without requiring any jacks to be reconfigured, the above system is also useful in initially setting-up a patching box. This would allow all of the jacks on the bridged modules to be wired in the same configuration.

V. Service Entry Module

Figure 13:
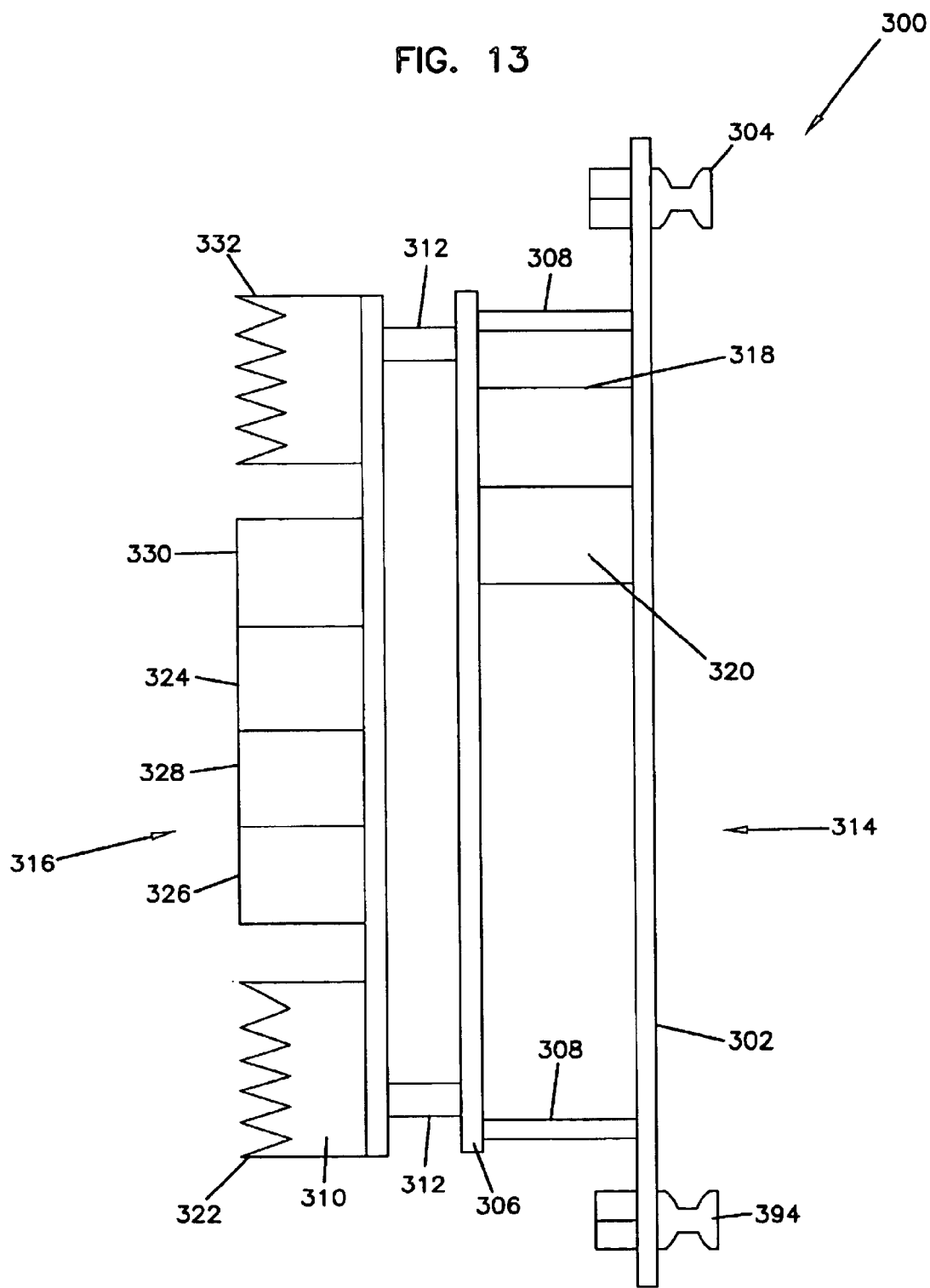
FIG. 13 schematically shows a service entry module constructed in accordance with the principles of the present invention.

Another aspect of the present invention relates to a service entry module 300 that can be used in combination with the test boxes 20 and 20'. As shown in FIG. 13, the module 300 includes a mounting plate 302 having snap fasteners 304. A first circuit board 306 is mechanically connected to the plate 302 by posts 308. A second circuit board 310 is electrically and mechanically connected to the first circuit board 306 by connectors 312.

The module 300 includes a front side 314 and a back side 316. At the front side 314 of the module 300, a test jack 318 (e.g., an RJ45 jack) and an output jack 320 (e.g., an RJ45) are mounted to the first circuit board 306. At the back side 316 of the module 300, an input connector 322 (e.g., an insulation displacement connector), a security jack 324 (e.g., an RJ31X jack), a DSL (Digital Subscriber Line) jack 326 (e.g., an RJ45 jack), a DSL loop-through jack 328, an output jack 330 (e.g., an RJ45 jack) and an output connector 332 (e.g., an insulation displacement connector) are connected to the second circuit board 310.

The input connector 322 allows four physical lines (e.g., POTS (Plain Old Telephone Service) lines) to be connected (e.g., "punched down") to interface with the service module 300. The test jack 318 allows access to all four lines connected at the input connector 322 for testing and installation purposes. The security jack 324 provides an interface for security systems (e.g., residential or business security systems) to seize a telephone line in the event of an emergency. The DSL jack 326 is provided for interfacing with a modem (not shown). Preferably, the modem can be mounted in the patching box on which the module 300 is mounted. The DSL signal can be distributed by a network hub (e.g., an Ethernet hub) that interfaces with the modem.

Figure 14:
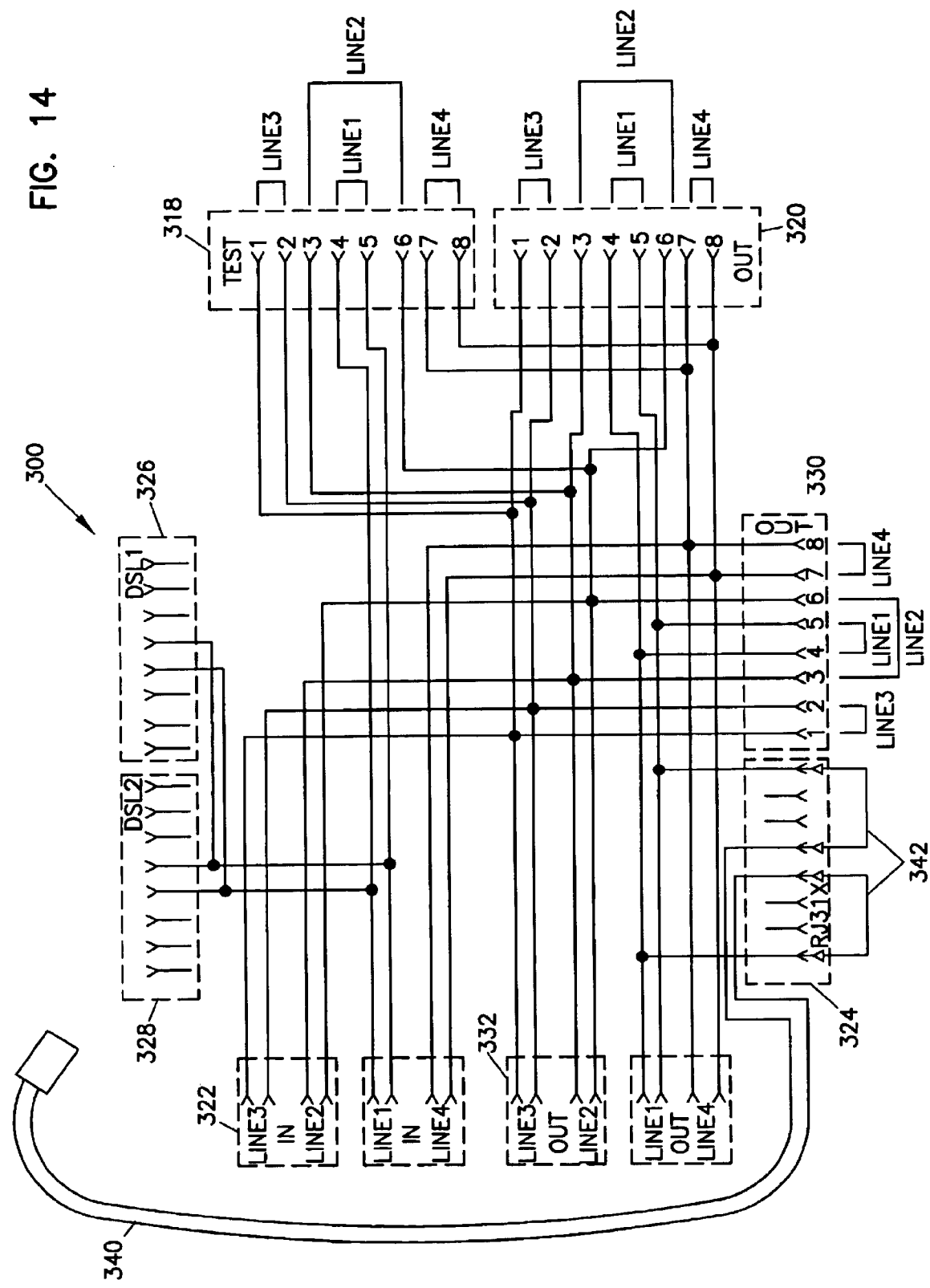
FIG. 14 is a wiring/tracing schematic for the module of FIG. 12.

A pass-through lead 340 (i.e., a lead with a connector at one end as shown in FIG. 14) is used to provide a connection from the loop-through jack 328 back to the module (e.g., the lead 340 loops back from the jack 328 to the security jack 324). The loop-through jack 328 and lead 340 provide access for an optional filter (e.g., a filter for removing data from a mixed voice/data twisted pair signal) to be placed into the phone network in the event that a DSL is present. A typical filter is a low pass filter capable of passing the relatively lower frequency voice content of a composite signal (e.g., less than about 4 kHz) and rejecting the composite signal content above the voice band (e.g., 30 kHz and above). The outputs 320, 330, and 332 provide the user with various options for outputting the telephone lines. When the module is used in a patching box, the outputs can be connected to bridging modules which are connected to individual termination locations/points located in the home or business that the patching box is servicing.

FIG. 14 shows a wiring/tracing schematic for the service module 300 of FIG. 12. As shown in FIG. 14, the input connector 322 allows 4 separate lines (e.g., lines 1–4) to interface with the module 300. Lines 1–4 are all connected to each of the outputs 320, 330 and 332. Each of the lines 1–4 is also connected to the test jack 318. Line 1 is connected to the DSL jack 326 and the loop through-jack 328. The lead 340 connects the loop-through jack 328 to the security jack 324. From the security jack 324, line 1 routes back to outputs 320, 330 and 332. In the event a DSL modem is connected to jack 326, a filter can be provided between the lead 340 and the jack 328 to remove data from the signal provided to the security jack 324. If line 1 is not a DSL line, then no filter is needed. A shorting plug 342 is used for routing line 1 through the security jack 324 back to outputs 320, 330 and 332 in the event no security system is connected to the security jack 324.

While a specific embodiment of the module 300 has been shown, it will be appreciated that changes can be made without departing from the principles of the invention. For example, components can be changed in position (i.e., moved from the front to the back or from the back to the front). Also, while the overall combination described above has advantages, certain components can be eliminated. For example, the module can be limited to one output connector. Further, certain structures such as the test jack, the security jack or other structures can be eliminated.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A multimedia patching box comprising:
   a generally rectangular housing including a first wall positioned opposite from a second wall, the housing also including opposing third and fourth walls that extend between the first and second walls, the housing further including a front and a back;
   a panel mounted adjacent the front of the housing, the panel including a front side and a back side, the panel being mounted to pivot about a pivot axis between an open position and a closed position, the pivot axis is located adjacent to the third wall of the housing and extends generally along the third wall of the housing;
   a plurality of multimedia connectors mounted on the panel;
   the housing defining at least one cable access opening defined through at least one of the first and second walls, the at least one cable access opening being located adjacent the third wall; and
   a cable management structure connected to the back side of the panel, the cable management structure defining a cable guiding channel that extends generally along the pivot axis of the panel and generally aligns with the at least one cable access opening.

2. The patching box of claim 1, wherein the cable management structure includes a plurality of spaced-apart cable management brackets which cooperate to define the cable guiding channel.

3. The patching box of claim 2, wherein the brackets include first legs that oppose and are spaced from the back side of the panel, and second legs that connect the first legs to the panel.

4. The patching box of claim 3, wherein gaps for passing cables are defined between the second legs, and bending radius limiters are provided at the second legs.

5. The patching box of claim 3, wherein the first and second walls of the housing are top and bottom walls and the third and fourth walls of the housing are vertical side walls, and wherein the cable management brackets are vertically spaced-apart such that the cable guiding channel extends in a vertical direction.

6. The patching box of claim 5, wherein at least portions of the first legs are angled upwardly relative to the second legs.

7. The patching box of claim 5, wherein the cable guiding channel is generally rectangular and includes: a) a first side defined by the first legs of the cable management brackets; b) a second side defined at least partially by the back side of the panel; c) a third side defined by the second legs of the cable management brackets; and d) a fourth side that opposes the third side, the fourth side being open when the panel is in the open position and closed by the third wall of the housing when the panel is in the closed position.

8. The patching box of claim 1, wherein the first and second walls of the housing are top and bottom walls and the third and fourth walls of the housing are vertical side walls.

9. The patching box of claim 1, wherein the housing includes a rear wall, and wherein the cable access opening comprises a rearwardly facing slot having a first portion defined by the first wall, a second portion defined by the second wall, and a third portion defined by the rear wall that extends from the first portion to the second portion.

10. The patching box of claim 9, wherein the first and second walls are top and bottom walls of the housing, and the third portion of the slot extends in a vertical direction.

* * * * *